United States Patent [19]

Yagi et al.

[11] Patent Number: 5,111,363
[45] Date of Patent: May 5, 1992

[54] MOUNT FOR ELECTRONIC PARTS

[75] Inventors: Nobuyuki Yagi; Jiroh Inagaki; Kozo Morita, all of Tokyo; Yosutoshi Kaku; Shinji Mizuno, both of Kanagawa; Akiko Yamanaka, Tokyo, all of Japan

[73] Assignee: Teikoku Tsushin Kogyo Co., Ltd., Kanagawa, Japan

[21] Appl. No.: 365,116

[22] Filed: Jun. 12, 1989

[30] Foreign Application Priority Data

| Jun. 23, 1988 | [JP] | Japan | 63-155632 |
| Jul. 21, 1988 | [JP] | Japan | 63-182575 |
| Sep. 14, 1988 | [JP] | Japan | 63-231880 |

[51] Int. Cl.$^5$ .............................................. H05K 1/00
[52] U.S. Cl. ..................... 361/398; 361/406; 361/413
[58] Field of Search ............... 29/840, 841, 843; 361/397, 398, 400, 402, 404–409, 395, 399, 411, 413, 417, 419–420, 386–389

[56] References Cited

U.S. PATENT DOCUMENTS

| 2,885,601 | 5/1959 | Pessel | 361/397 |
| 4,188,714 | 2/1980 | Jean | 29/628 |
| 4,208,005 | 6/1980 | Nate et al. | 29/840 |
| 4,584,767 | 4/1986 | Gregory | 29/848 |
| 4,631,820 | 12/1986 | Harada et al. | 29/840 |
| 4,783,888 | 11/1988 | Fujii et al. | 29/840 |

FOREIGN PATENT DOCUMENTS 2181302  4/1987  United Kingdom ............... 361/397

OTHER PUBLICATIONS

Dougherty, "Connection of Discrete Leads to Packaged Circuits", IBM Technical Disclosure Bulletin vol. 14, No. 8, Jan. 1972, p. 2435.

Primary Examiner—Gregory D. Thompson
Attorney, Agent, or Firm—Wenderoth, Lind & Ponack

[57] ABSTRACT

A mount for electronic parts includes a flexible board made of a thermoplastic resin film and having electrically conductive patterns formed thereon, and an electrically conductive bonding agent for bonding terminals of the electronic parts to the conductive patterns. Some or all of the electronic parts to be mounted are resin-molded to the flexible board so as to be integrated therewith.

19 Claims, 17 Drawing Sheets

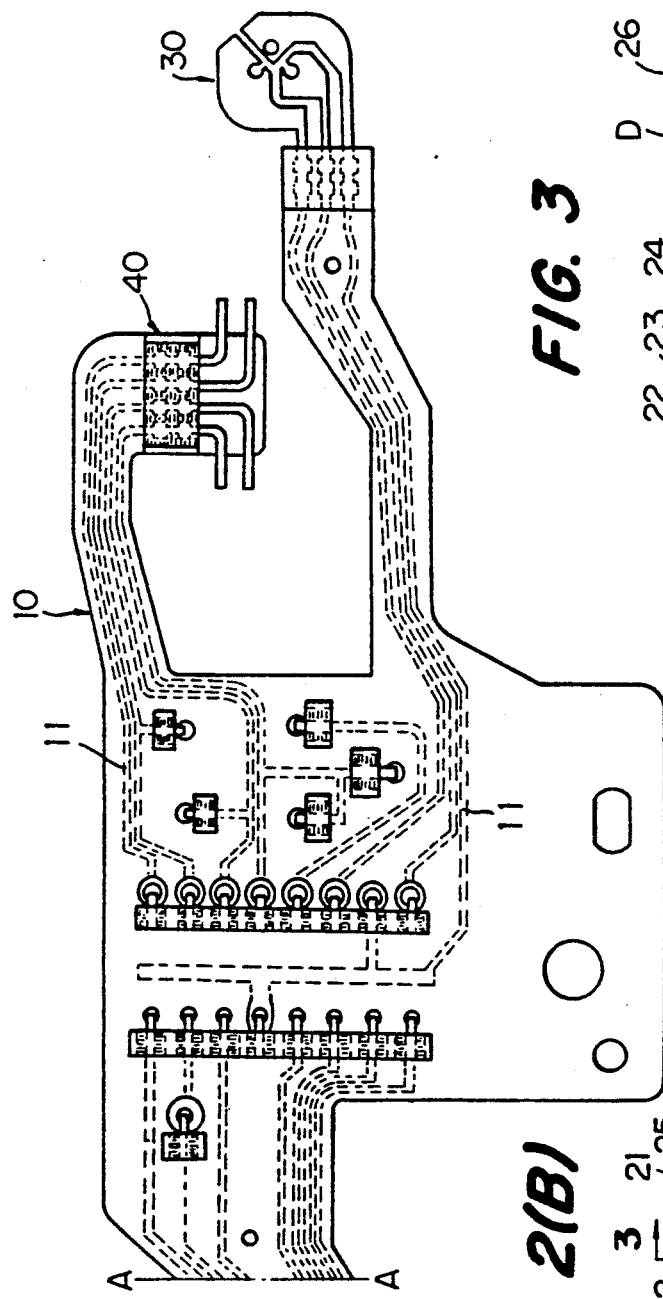
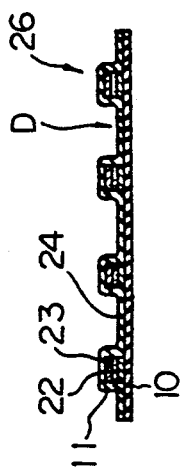
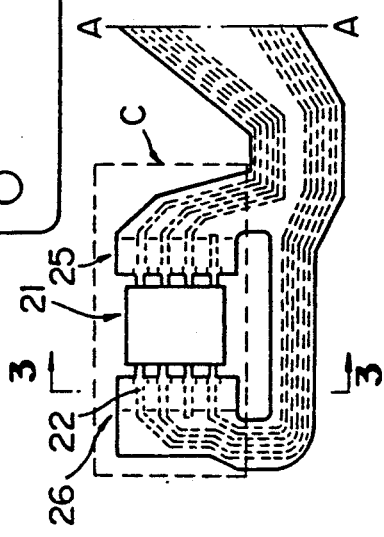

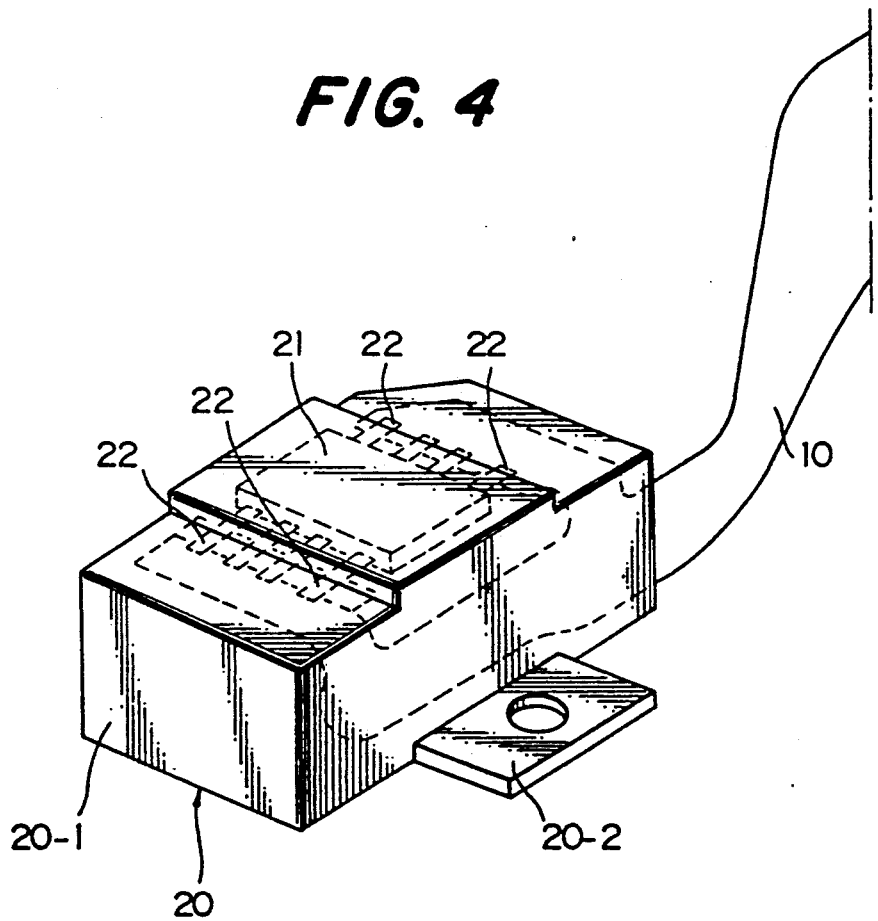

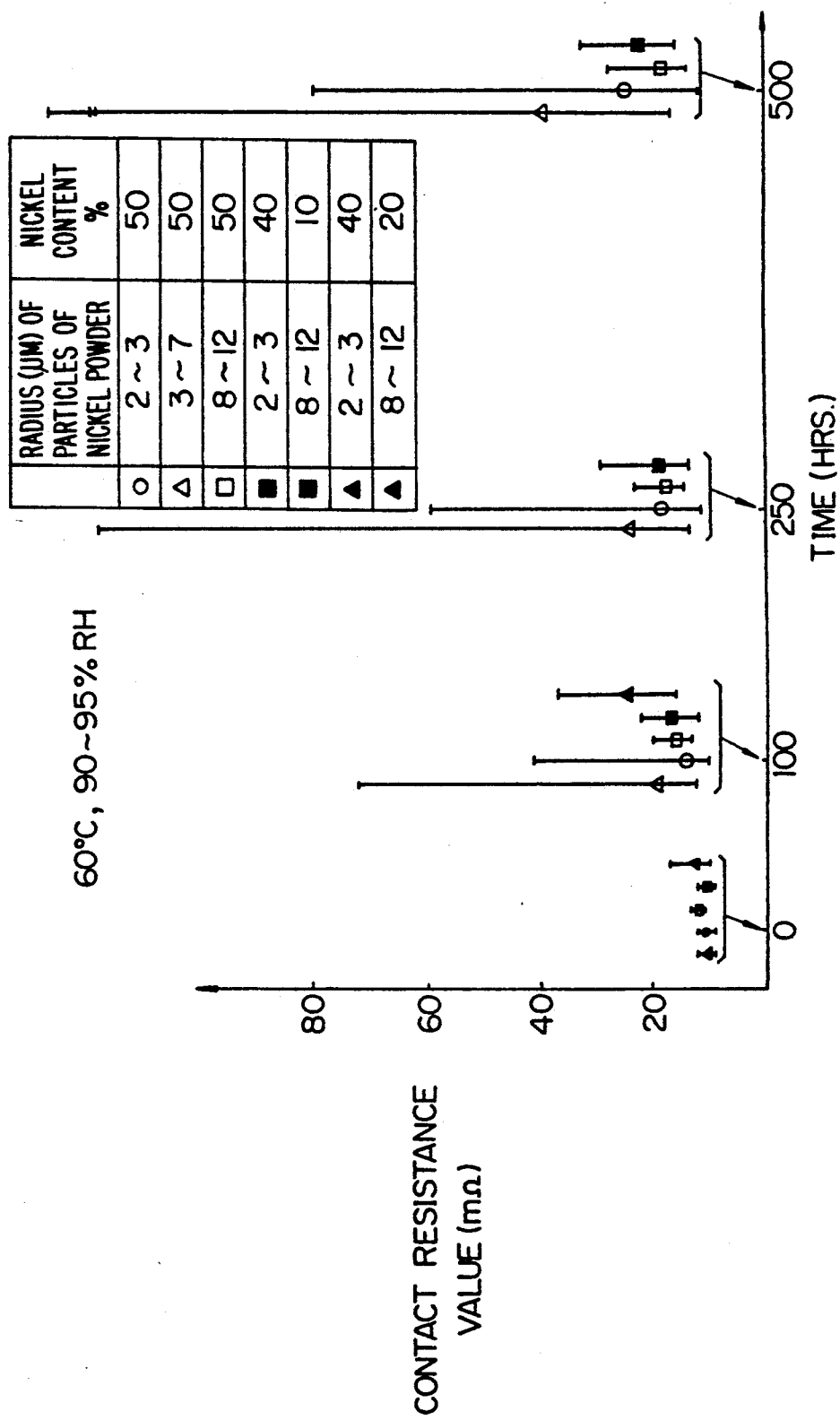

FIG. 14

| CONDUCTIVE BONDING AGENT | ULTRASONIC WELDING | INITIAL VALUE | HUMIDITY EXPERIMENT: 60°C, 90—95% RH | |
|---|---|---|---|---|
| | | | 24Hr | 100Hr |
| NICKEL POWDER + POLYESTER RESIN | YES | 2~4mΩ | MILLIOHM ORDER | MILLIOHM ORDER |
| NICKEL POWDER + POLYESTER RESIN | NO | 10~15mΩ | 10 MILLIOHM ORDER | 10 MILLIOHM ORDER |
| COPPER POWDER + POLYESTER RESIN | NO | 3~650mΩ | 10 OHM ORDER | 10 OHM ORDER |
| SILVER POWDER + POLYESTER RESIN | NO | 2~40mΩ | OHM ORDER | 10 OHM ORDER |
| SOLDER(Sn:Pb=6:4) + POLYESTER RESIN | NO | 5~70mΩ | OHM ORDER | 10 OHM ORDER |

MOUNT FOR ELECTRONIC PARTS

BACKGROUND OF THE INVENTION

This invention relates to a mount for mounting various electronic parts in an electronic device, wherein the parts are supported on a flexible board comprising a resin film.

Various electronic devices include a case accommodating an electronic parts mount in which a variety of electronic parts are mounted on a printed board. In almost all cases the electronic parts mount is so adapted that the parts are mounted on a rigid printed board comprising a resin. In recent years, however, attempts have been made to mount electronic parts on a printed board constituted by a flexible substrate, which comprises a synthetic resin film, upon taking into consideration the shape of the electronic device accommodating the mount, the specific operation of the electronic device and the connection between associated cables and the printed board. In these attempts, the flexible board is made to deform in accordance with the shape of the case of the device and is made to perform the function of a cable as well.

However, in the conventional electronic parts mount employing the aforementioned flexible board, the parts are mounted by soldering, so that a highly heat-resistant resin film comprising, for example, polyamide is used as the flexible board. A drawback with this expedient is the fact that a highly heat-resistant flexible film is expensive and is therefore impractical as far as providing an inexpensive parts mount is concerned.

In a device such as an optical disk pick-up, it is a light-receiving element which receives light reflected from an optical disk is required to be disposed precisely at a desired position. When such a light-receiving element is mounted on the aforementioned flexible board, there is no appropriate method through which the element can be disposed in a precise positional relationship relative to a desired position by a simple arrangement. Though flexible boards have recently been developed in which silver paste or the like is printed on a thermoplastic resin film such as polyester film, the fact that lands and patterns are formed on such a flexible board by the printing of an electrically conductive paste means that they will exhibit a high intrinsic resistance, thus making it difficult to obtain a large current capacity. Another problem is that since the film is thermoplastic, soldering cannot be employed. This makes it difficult to obtain a mount which is mechanically strong.

Accordingly, an object of the present invention is to provide a mount for electronic parts, in which an inexpensive thermoplastic resin film is used as a printed board, a large current capacity is obtained and the terminals of the parts can be strongly secured to lands and patterns on the board without employing soldering.

SUMMARY OF THE INVENTION

According to the present invention, the foregoing object is attained by providing a mount for electronic parts, wherein terminals or terminal metal pieces of various electronic parts are affixed by an electrically conductive bonding agent to electrically conductive patterns on a flexible board comprising a thermoplastic resin film on which the electrically conductive patterns are formed. This makes it possible to mount various electronic parts on a flexible board without requiring the high-temperature heating employed in soldering or the like. As a result, an inexpensive mount for electronic parts can be realized.

In a preferred embodiment of the invention, some or all of the electronic parts mounted on the flexible board are molded in resin along with the flexible board, whereby these electronic parts and the flexible board are integrated to form a unitary body. Accordingly, when the mount is incorporated in an electronic device and an electronic part requires high positional precision, as in the case of the light-receiving element of a pick-up mechanism in a CD apparatus, the part can be secured with the required positional precision by affixing the resin-molded body at a predetermined positioning location.

Further, according to the invention, aluminum foil, which constitutes an electrically conductive pattern formed on the flexible board, is formed by etching. This provides a greater current capacity in comparison with an electrically conductive pattern formed by printing of a silver paste.

In another embodiment of the invention, an electrically conductive paste comprising a resin and a powder of metal such as nickel kneaded in with the resin is used as the electrically conductive bonding agent. This makes it possible to obtain an excellent, highly stable electrical connection between the terminals of the electronic parts and a foil of a metal such as aluminum.

BRIEF DESCRIPTION OF THE DRAWINGS

FIGS. 2(A), (B) are bottom views of a flexible board in the mount of FIG. 1;

FIG. 3 is a sectional view taken along line 3—3 of FIG. 2(B);

FIG. 4 is a perspective view of a light-receiving unit in the mount of FIG. 1;

FIGS. 5(A)–5(G) illustrate the light-receiving unit, wherein FIG. 5(A) is a plan view, FIG. 5(B) a side view as seen in the direction of arrow A in FIG. 5(A), FIG. 5(C) is a side view as seen in the direction of arrow B in FIG. 5(A), FIG. 5(D) is a bottom view, FIG. 5(E) is a sectional view taken along line 5(E)—5(E) of FIG. 5(D), FIG. 5(F) is a sectional view taken along line 5(F)—5(F) of FIG. 5(D), and FIG. 5(G) is a sectional view taken along line 5(G)—5(G) of FIG. 5(D);

FIGS. 6(A)–6(D) illustrate a mold for the resin molding of a base of the light-receiving unit, wherein FIG. 6(A) is a plan view of a lower mold, FIG. 6(B) is a side sectional view of the lower mold and an upper mold [namely a side sectional view taken along line 6(B)—6(B) in FIG. 6(A)], FIG. 6(C) is a sectional view of the combined molds [namely a sectional view taken along line 6(C)—6(C) in FIG. 6(A)], and FIG. 6(D) is a sectional view of the combined molds [namely a sectional view taken along line 6(D)—6(D) in FIG. 6(A)];

FIG. 12 is a chart showing the results obtained by measuring contact resistance (milliohms) relative to aluminum in a humidity resistance experiment using an electrically conductive paste comprising a mixture of polyester resin and nickel powder;

FIG. 14 is a table of results obtained by measuring contact resistance of a metal terminal piece relative to aluminum foil when using an electrically conductive paste comprising a mixture of polyester resin and nickel powder as well as other types of electrically conductive pastes;

FIGS. 15(A)-15(C) illustrate another structure of the terminal portions, in which FIG. 15(A) is a plan view, FIG. 15(B) is a side sectional view and FIG. 15(C) is a sectional view taken along line 15(C)—15(C) of FIG. 15(A);

FIGS. 17(A), (B) illustrate the structure of a clamping-type connector for accommodating the terminal portion, wherein FIG. 17(A) is a front view and FIG. 17(B) is a side sectional view;

FIGS. 20(A)-20(D) illustrate the structure of a female pin, wherein FIG. 20(A) is a plan view, FIG. 20(B) is a side view, FIG. 20(C) is a front view and FIG. 20(D) is a front view of the female pin and the male pin fitted; and FIGS. 21(A)-21(C) show the female pins in a state connected to the end portion of the flexible board, wherein FIG. 21(A) is a plan view, FIG. 21(B) is a sectional view taken along line 21(B)—21(B) of FIG. 21(A), and FIG. 21(C) is an enlarged view of a portion of FIG. 21(B).

DETAILED DESCRIPTION OF THE PREFERRED EMBODIMENTS

Embodiments of the invention will now be described in detail with reference to the drawings.

Figure 1:
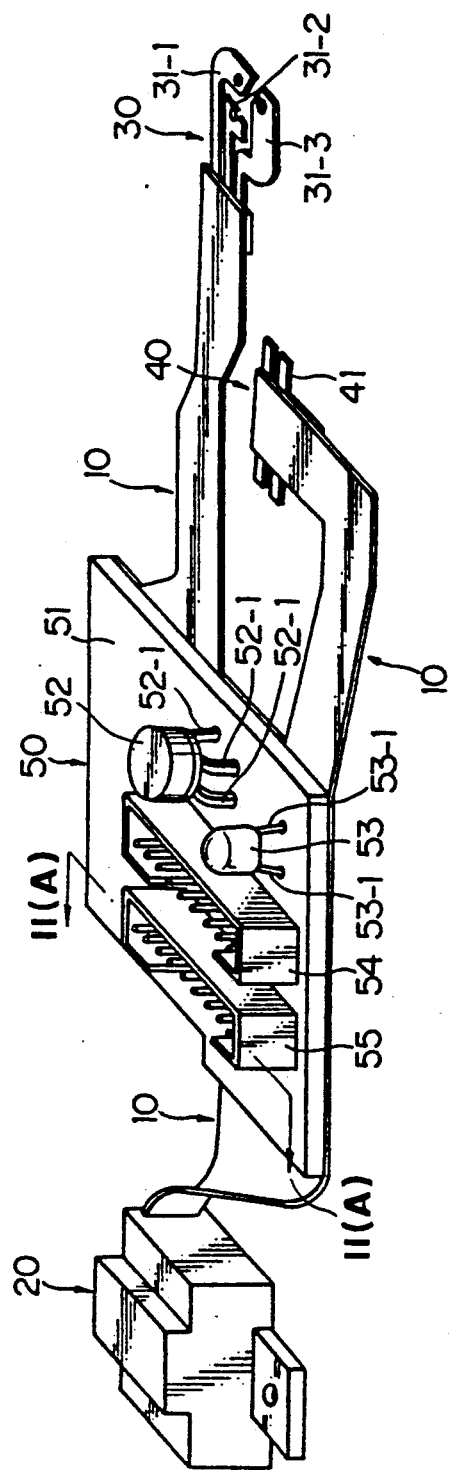
FIG. 1 is a perspective view of an electronic parts mount according to the present invention.

FIG. 1 is a view showing the external appearance of an electronic parts mount according to the present invention. This embodiment relates to an electronic parts mount used in the pick-up mechanism of a CD apparatus. As shown in FIG. 1, the electronic parts mount comprises a flexible board 10 to which a light-receiving unit 20 including a light-receiving element is mounted in a manner described later, and is integrated with the flexible board by molding the board in resin, a light-emitting element mount 30 for supporting a light-emitting element such as laser diode, a terminal portion 40 for connecting the pick-up device with external equipment, and an electronic parts mounting portion 50 on which various electronic parts are mounted. The structure of each of the above portions will now be described in detail.

The flexible board 10 comprises a thermoplastic resin film consisting of polyester or the like. The upper surface of the flexible board 10 is provided with aluminum foil by bonding or vapor deposition, and the aluminum foil is selectively etched away to form electrically conductive patterns 11. The latter are insulated by the application of a resin coating to all but terminals and terminal pieces of electronic parts on the patterns 11. FIG. 2(A) is a view of the underside of the flexible board 10 not having been molded and shows the right side thereof cut along the line A—A. FIG. 2(B) is a view of the underside of the flexible board 10 and shows the left side thereof, namely the side to the left of line A—A.

As shown in FIGS. 1, 2(B) and 3, the light-receiving unit 20 includes a light-receiving element 21 having terminals 22 bonded by an electrically conductive bonding agent 23 to the end portions of the conductive patterns 11 of flexible board 10. The terminals are covered by a reinforcing sheet 24 comprising a resin film consisting of the same material as the flexible board 10. Portions D devoid of the terminals 22 are welded by ultrasonic welding to the flexible board 10 thereby completing the fabrication of terminal portions 25, 26. The light-receiving element 21 is thus mounted on the flexible board 10. The portion C enclosed by the dashed line in FIG. 2(B) is molded to resin to integrate the light-receiving element 21 and the flexible board 10. The structure of the light-receiving portion and the method of manufacturing the same will now be described in detail.

Figure 5A:
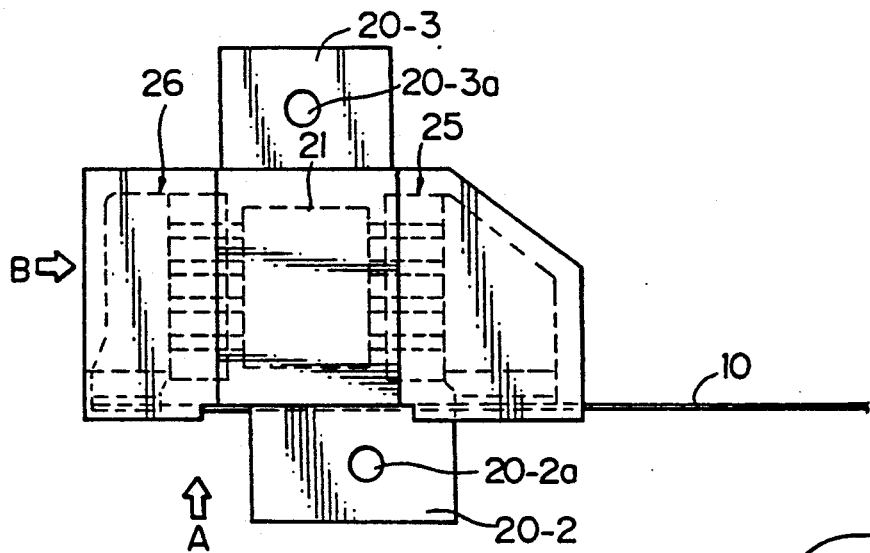
Figure 5B:
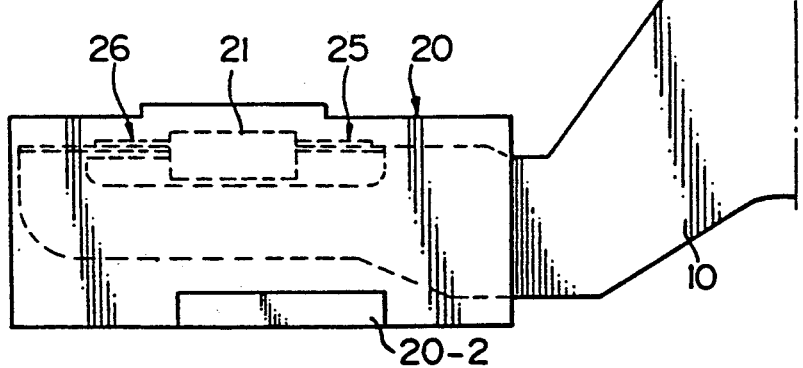
Figure 5C:
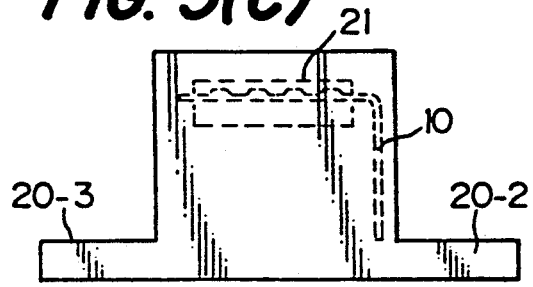
Figure 5D:
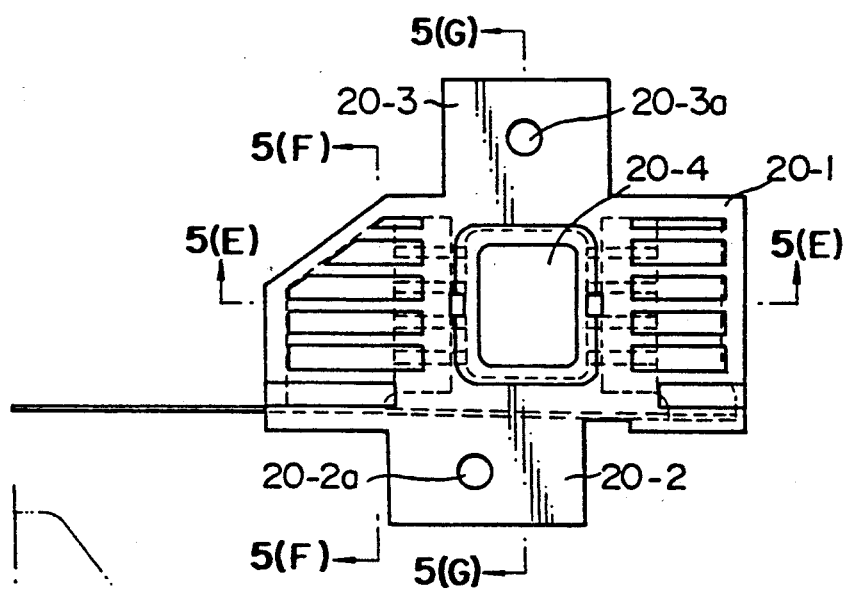
Figure 5E:
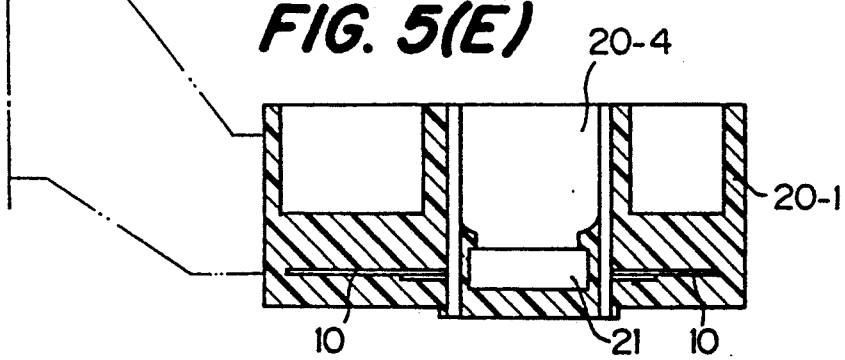
Figures 5F, 5G:
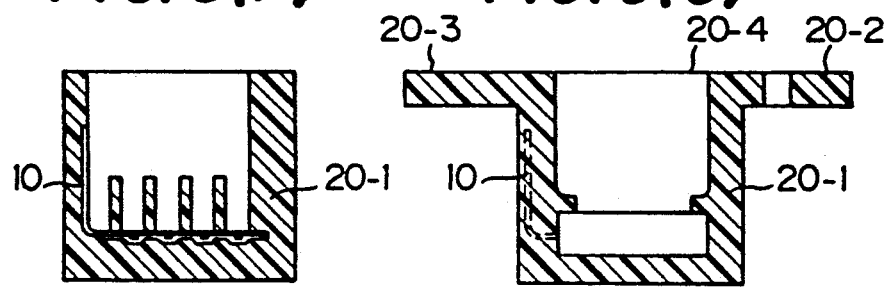

FIG. 4 is a perspective view showing the external appearance of the light-receiving unit 20, FIG. 5(A) is a plan view of the light-receiving unit, FIG. 5(B) is a side view as seen in the direction of arrow A in FIG. 5(A), FIG. 5(C) is an end view as seen in the direction of arrow B in FIG. 5(A), FIG. 5(D) is a bottom view of the light-receiving unit 20, FIG. 5(E) is a sectional view taken along line 5(E)—5(E) of FIG. 5(D), FIG. 5(F) is a sectional view taken along line 5(F)—5(F) of FIG. 5(D), and FIG. 5(G) is a sectional view taken along line 5(G)—5(G) of FIG. 5(D). As shown in these drawings, the light-receiving unit 20 has a base 20-1 provided with fixing members 20-2, 20-3 having fastener-receiving holes 20-2a, 20-3a defined therein for allowing the light-receiving unit 20 to be fixed to an apparatus at a predetermined position thereon. When the base 20-1 is molded of synthetic resin, terminals 22, 22 are fixedly connected to corresponding terminal portions of the conductive patterns 11 on the flexible board 10, after which the unitary body consisting of the light-receiving element 21 and flexible board 10 is insert-molded in the base. At this time the light-receiving surface of the light-receiving element 21 faces a cavity 20-4 through which light from an optical system (not shown) of the pick-up mechanism passes.

Figure 6A:
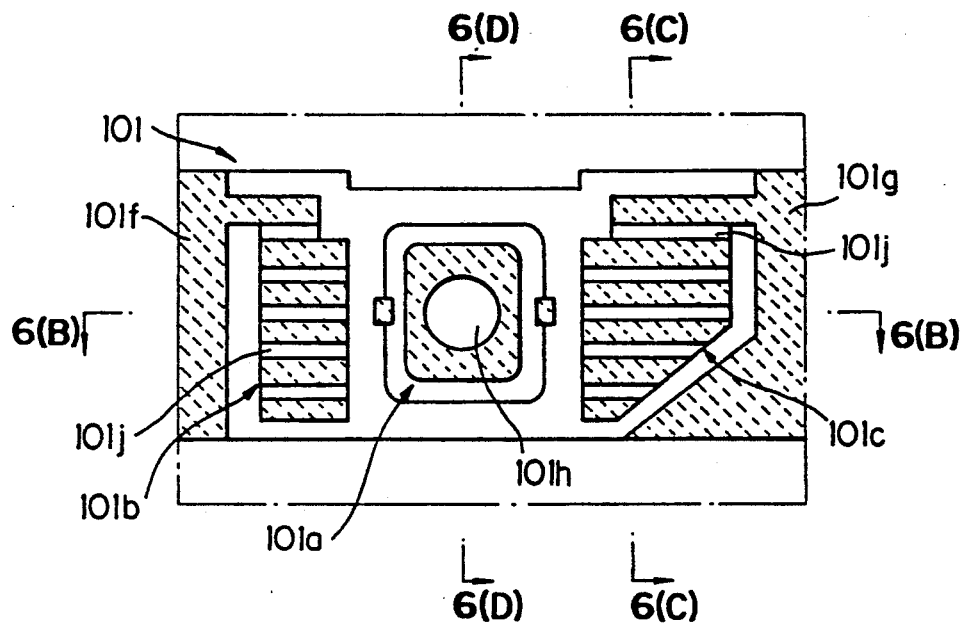
Figure 6B:
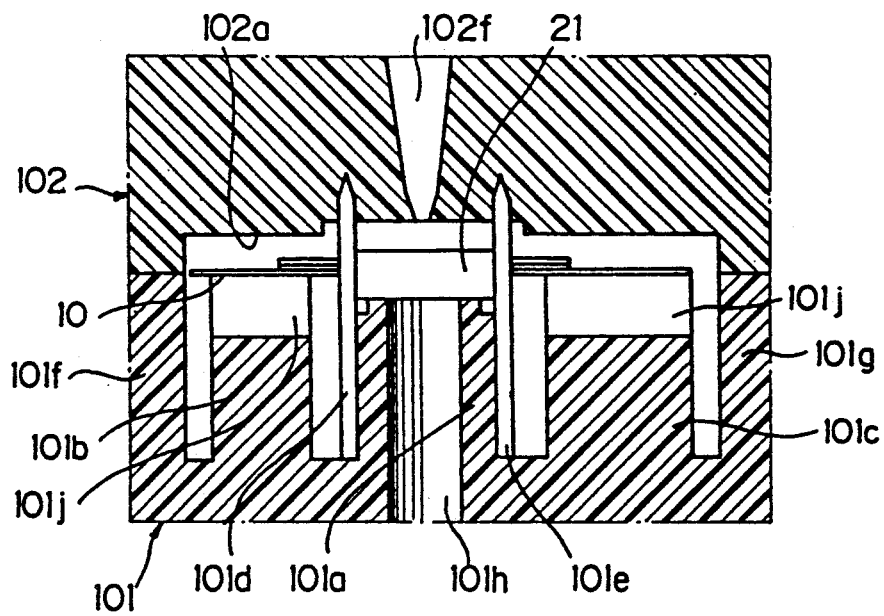

6(A)-6(D) illustrate the structure of a mold for the resin molding of the base 20-1. FIG. 6(A) is a plan view of a lower mold 101, FIG. 6(B) a side sectional view of the lower mold 101 and an upper mold 102 [namely a side sectional view taken along line 6(B)-6(C) in FIG. 6(A)], FIG. 6(C) a sectional view of the molds [namely a sectional view taken along line 6(C)—6(C) in FIG. 6(A)] and FIG. 6(D) a sectional view of the combined molds [namely a sectional view taken along line 6(D)—6(D) in FIG. 6(A)]. As shown in these drawings, the lower mold 101 is formed to include support members 101a, 101b, 101c having support surfaces [portions indicated by the diagonal dashed lines in FIG. 6(A)] for supporting the light-receiving element 21 and flexible board 10. The central support member 101a supports the light-receiving element 21. The central portion of the support member 101a is formed to have a cavity 101h for mitigating the deposition of gases of decomposition, which evolve when molten resin is injected, on the receiving surface of the light-receiving element 21, and for preventing damage to the light-receiving surface when heat and pressure are applied with the element in contact with the support body. The left and right end portions of the lower mold 101 are formed to have side wall members 101f, 101g which come into abutting contact with the upper surface of the upper mold 102, described below. Opposite sides of the support member 101a are provided with positioning support pins 101d, 101e at positions embracing the light-receiving element 21. These support pins 101d, 101e are inserted into respective positioning holes provided in the upper mold 102. The upper surfaces of the support members 101b and 101c are formed to have a plurality of narrow grooves 101j.

The upper mold 102 is formed to have a recess 102a into which the support members 101a, 101b, 101c of lower mold 101 are inserted. The sides of the upper mold 102 are formed to include respective wall members 102b, 102c each having a surface which abuts against the lower surface of the lower mold 101. The lower portions of the wall members 102b, 102c are formed to have respective recesses 102d, 102e for forming the respective base fixing members 20-2, 20-3 of the aforementioned base 20-1. The central portion of the upper mold 101 is formed to have a pin gate 102f for facilitating the injection of the molten resin.

Figure 6C:
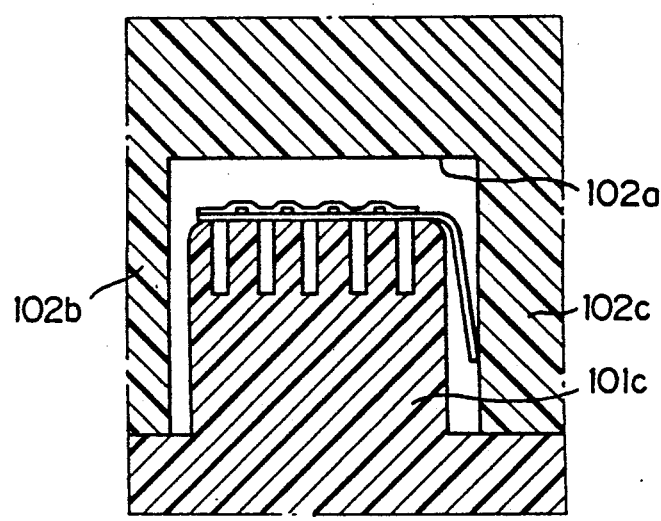
Figure 6D:
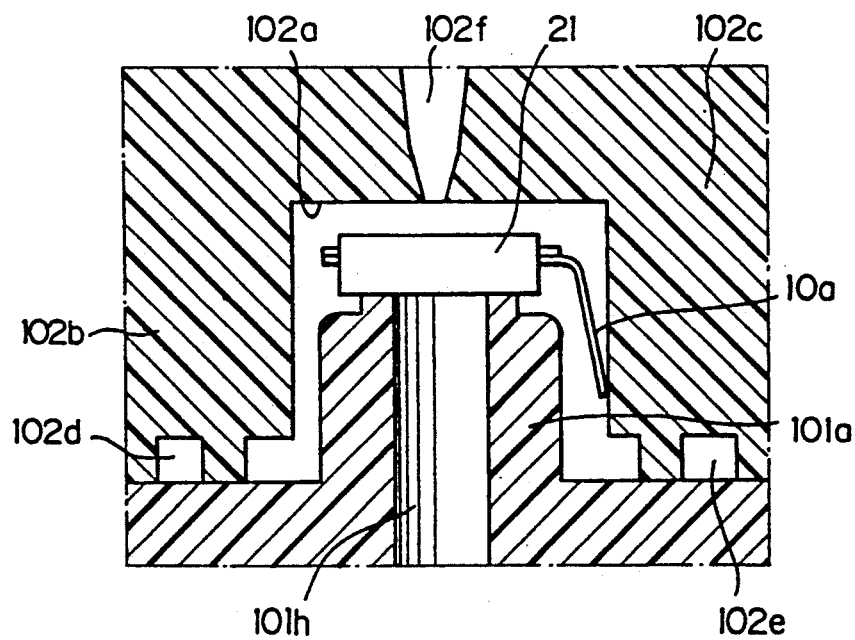

The light-receiving element 21 mounted on the flexible board 10 is disposed in such a manner that its light-receiving surface is situated on the upper surface of the support member 101a of the lower mold 101 (i.e., the light-receiving element 21 is situated between the support pins 101d and 101e), and the upper mold 102 is combined with the lower mold 101 with the support pins 101d, 101e of the lower mold 101 being inserted into the positioning holes of the upper mold 102. This causes the side portion of flexible board 10 to bend along the wall surface of the wall member 102c, as shown in FIGS. 6(C), (D). Under these conditions, molten resin is injected through the pin gate 102f of the upper mold 102 to fill the space formed by the lower mold 101 and upper mold 102. Allowing the resin to cool and solidfy completes the formation of the light-receiving unit 20. More specifically, by injecting the molten resin, the flexible board 10 situated on the upper surfaces of the support members 101b, 101c assumes a state in which it is sandwiched between the molten resin that flows into the plurality of slender grooves 101j formed in the upper surfaces of the support members 101b, 101c and the molten resin that flows into the space at the bottom portion of the upper mold 102. At the same time, a portion 10a of the flexible board 10 protruding to the side of the support members 101a, 101b, 101c comes to be insert-molded vertically at the inner wall surface of the base 20.

Examples of the molten resin that can be used include polyphenyl sulfide, polyethylene terephthalate and liquid-crystal polymer.

In the foregoing embodiment, a portion of the flexible board 10 is insert-molded into the base 20-1 of the light-receiving unit 20 in a state bent downwardly at right angles relative to the light-receiving element 21. This is so that the light-receiving element 21 may convert light reflected from a disk into an electric signal and send the signal to the external apparatus. Accordingly, depending upon the disposition and placement of the external apparatus, the insert molding can be performed in the most suitable manner.

Figure 7A:
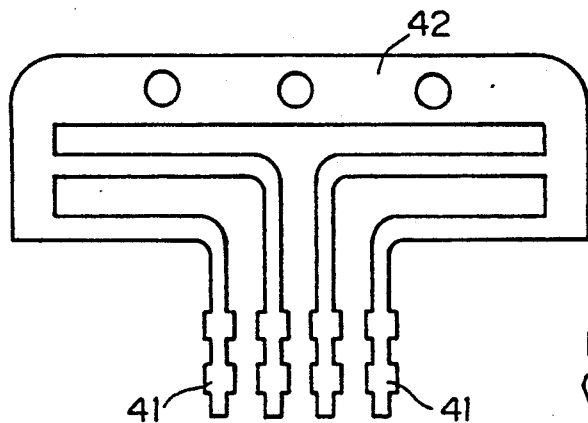
FIGS. 7(A), (B)
Figure 7B:
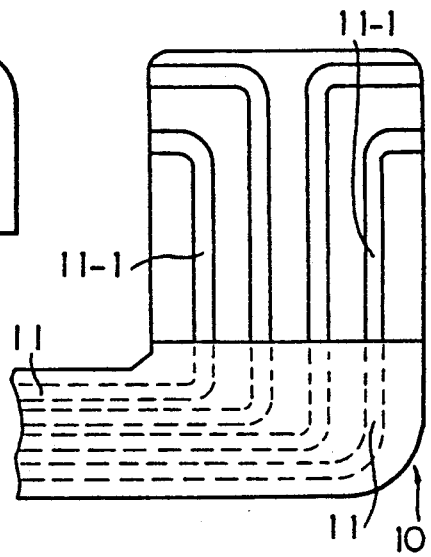
Figure 8A:
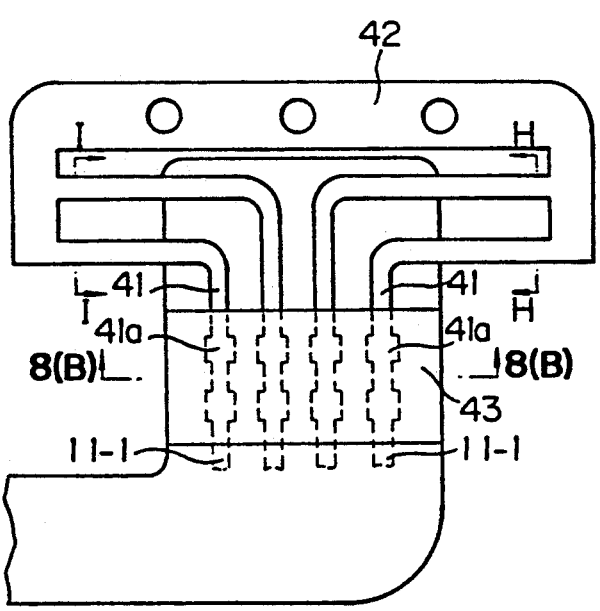
FIGS. 8(A)–8(C) illustrate the structure of a terminal portion of the mount of FIG. 1 as well as the process for forming the same.
Figure 8B:
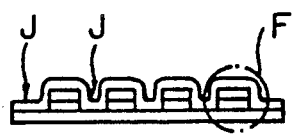
Figure 8C:
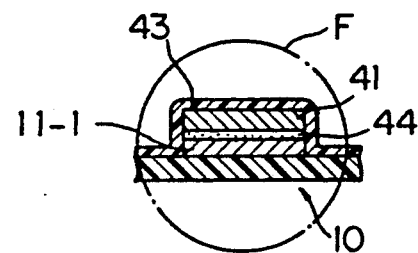

FIGS. 7(A), (B) and 8(A)-8(C) illustrate the structure of the terminal portion 40 and the process for forming the same. To form the terminal portion 40, four terminal pieces 41 and a frame 42 of the kind shown in FIG. 7(A) are integrally formed by sheet-metal working or the like, and an electrically conductive bonding agent (44) is applied to end portions 11-1 of the conductive patterns 11 that are disposed on the flexible board 10 at that portion thereof forming the terminal portion 40, as shown in FIG. 7(B). As illustrated in FIGS. 8(A), (B), the terminal pieces 41 are placed on the conductive bonding agent, thereby being connected to the corresponding end portions 11-1 of the conductive patterns 11. Thereafter, the reinforcing sheet 43 comprising a resin film of the same material as that of the flexible board 10 is placed on the terminal pieces 41, and the reinforcing sheet 43 and the flexible board 10 are welded together ultrasonically at portions J devoid of the terminal pieces 41, thereby strongly securing the terminal pieces 41 to the end portions of the flexible board 10. The terminal pieces 41 are then cut along lines H—H and I—I in FIG. 8(A) and the frame 42 is removed, thereby completing the terminal portion 40. FIG. 8(B) is a sectional view taken along line 8(B)—8(B) of FIG. 8(A), and FIG. 8(C) is an enlarged view of a portion F in FIG. 8(B). As illustrated in these figures, the terminal pieces 41 are connected by the electrically conductive bonding agent 44 to the end portions 11-1 of the conductive patterns 11 formed on the flexible board 10, and the terminal pieces 41 are covered by the reinforcing sheet 43.

Each of the end portions of the terminal pieces 41 are formed to have a plurality of projections 41a. By locally welding the reinforcing sheet 43 and the flexible board 10 together, the projections 41a engage the welds to enhance the pulling strength of the terminal pieces 41.

A phosphor bronze sheet is employed as the metal used for the terminal pieces 41, and the surface of this metal sheet is plated with solder in order to facilitate the soldering operation. However, since aluminum and lead have poor compatibility, solder having a low lead content of 10% or less is used. In addition, it is permissible to employ a metal sheet having a soldering capability or one plated with solder as the metal sheet used for the terminal pieces 41.

Figure 9A:
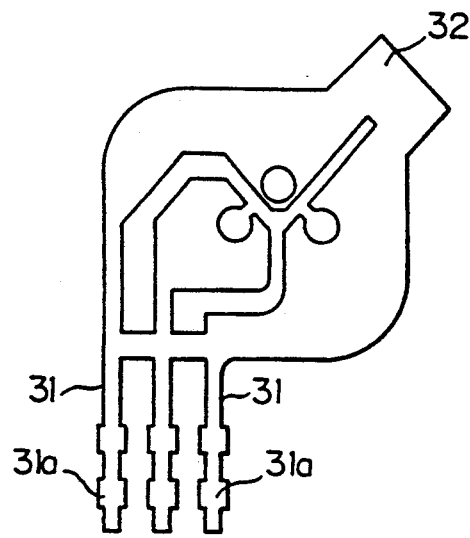
FIGS. 9(A), (B)
Figure 9B:
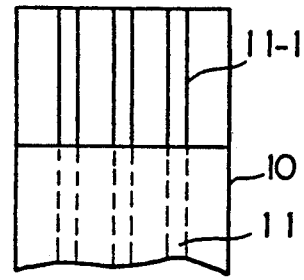
Figure 10A:
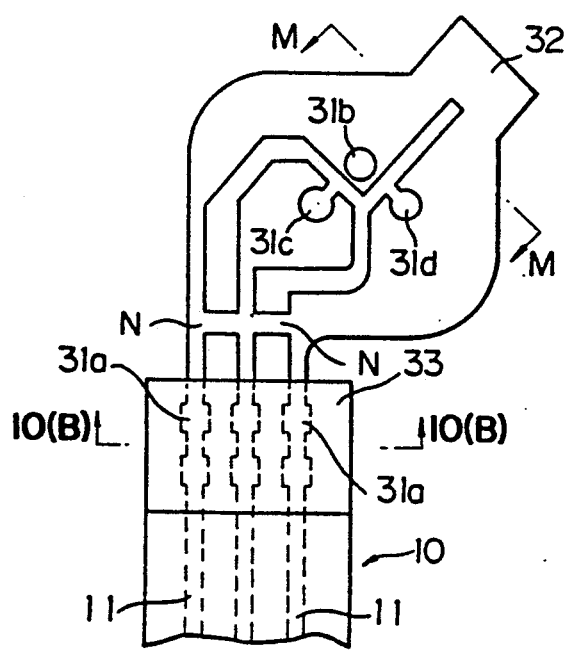
FIGS. 10(A)–10(C) illustrate the structure of a light-emitting element mounting portion of the mount of FIG. 1 as well as the process for forming the same.
Figure 10B:
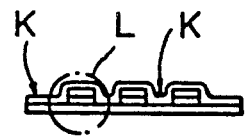
Figure 10C:
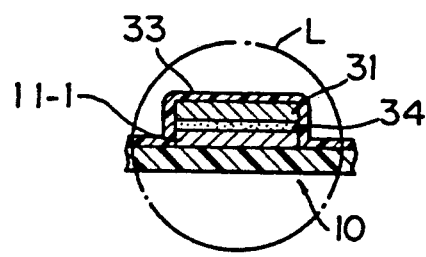

FIGS. 9(A), (B) and 10(A)-10(C) illustrate the structure of the light-emitting element mounting portion 30 and the process for forming the same. To form the mounting portion 30, three terminal pieces 31 and a frame 32 of the kind shown in FIG. 9(A) are integrally formed by sheet-metal working or the like, and an electrically conductive bonding agent 34 is applied to end portions 11-1 of the conductive patterns 11 that are disposed on the flexible board 10 at that portion thereof forming the mounting portion 30, as shown in FIG. 9(B). As illustrated in FIGS. 10(A)-(C), the terminal pieces 31 are placed on the conductive bonding agent, thereby being connected to the corresponding end portions 11-1 of the conductive patterns 11. Thereafter, a reinforcing sheet 33 comprising a resin film of the same material as that of the flexible board 10 is placed on the terminal pieces 31, and the reinforcing sheet 33 and the flexible board 10 are locally welded together ultrasonically at portions K devoid of the terminal pieces 31, thereby strongly securing the terminal pieces 31 of the light-emitting element mounting portion 30 to the end portion of the flexible board 10.

Each of the end portions of the terminal pieces 31 are formed to have a plurality of projections 31a. By locally welding the reinforcing sheet 33 and the flexible board 10 together, the projections 31a engage the welds to enhance the pulling strength of the terminal pieces 31.

The terminal pieces 31 subsequently are cut along line M—M in FIG. 10(A), the frame 32 is removed, and then portions N, N connecting the terminal pieces 31 together are cut away, thereby completing the light-emitting element mounting portion 30. FIG. 10(B) is a sectional view taken along line 10(B)-10(B) of FIG. 10(A), and FIG. 10(C) is an enlarged view of a portion L in FIG. 10(B). As illustrated in these figures, the terminal pieces are connected by the electrically conductive bonding agent 34 to the end portions 11-1 of the conductive patterns 11 formed on the flexible board 10, and the terminal pieces 31 are covered by the reinforcing sheet 33. As in the case of the terminal pieces 41, a phosphor bronze sheet is employed as the metal used for the terminal pieces 41. The surface of this metal sheet is plated with solder having a low lead content in order to facilitate the soldering operation. It is permissible to employ another metal sheet having a soldering capability as the metal sheet used for the terminal pieces 31. The terminal pieces 31 are formed to have holes 31b, 31c, 31d in which the terminals of a laser diode are inserted. The laser diode can be mounted on the light-emitting element mounting portion 30 by soldering the terminals of the diode to the terminal pieces 31.

As shown in FIG. 1, the electronic parts mounting portion 50 has a rigid retaining plate 51 affixed to the upper portion of the flexible board 10. A semi-fixed resistor 52, a tantalum capacitor 53 and connectors 54, 55 are mounted on the retaining plate 51 at predetermined positions.

Figure 11A:
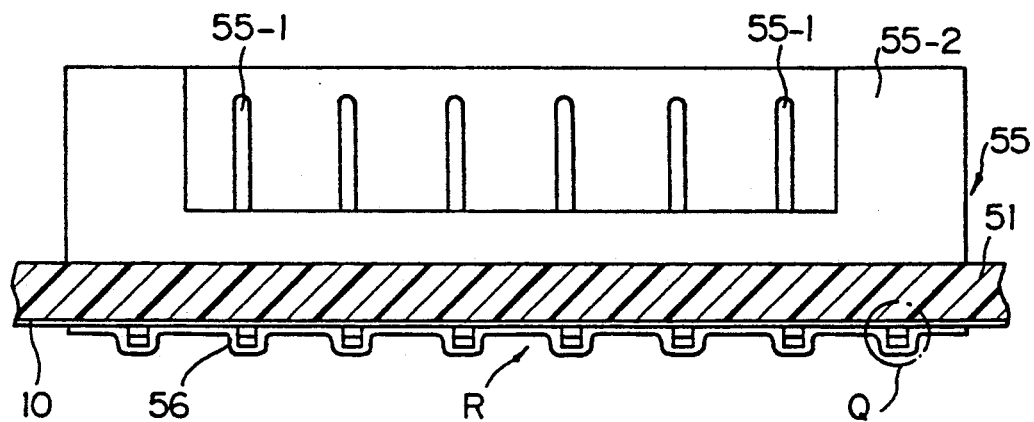
FIG. 11(A) is a view illustrating the structure of a connector mount (namely a sectional view taken along line 11(A)—11(A) of FIG. 1)
Figure 11B:
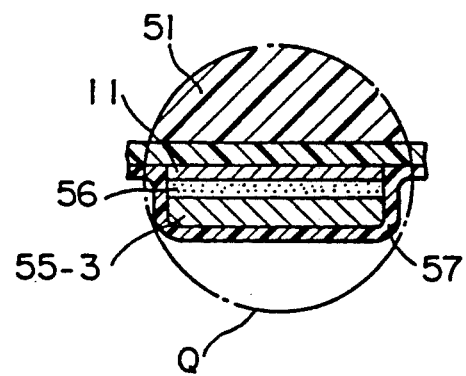
FIG. 11(B) is an enlarged view of a portion Q in FIG. 11(A)

FIG. 11(A) illustrates the mounting structure of the connector 55 (namely a sectional view taken along line 11(A)-11(A) of FIG. 1), and FIG. 11(B) is an enlarged view of a portion Q in FIG. 11(A). The connector 55 is a male connector having a number of pins 55-1 projecting from the interior of a resin case 55-2. Fitted into the male connector 55 is a female connector (not shown) having female pins for receiving the pins 55-1. Terminals 55-3 connected to the pins 55-1 project from the bottom portion of the connector 55. These terminals 55-3 are bent at the surface of the flexible board 10 upon passing through holes formed in the retaining plate 51 and flexible board. The conductive patterns 11 are formed at the positions of the board surface where the terminals 55-3 are bent. The surfaces of the conductive patterns are coated with electrically conductive bonding agent 56, and the bent terminals 55-3 are brought into abutting contact with the conductive bonding agent to connect the terminals 55-3 with the conductive patterns 11. A reinforcing sheet 57 comprising a resin film of the same material as that of the flexible board 10 is placed on the terminals 55-3, and the reinforcing sheet 57 and the flexible board 10 are locally welded together ultrasonically at portions R devoid of the terminals 55-3. The mounting structure for the connector 54 is substantially the same as that for the connector 55 and need not be described.

Though the mounting structure for the semi-fixed resistor 52 is not illustrated, three terminals 52-1 of the resistor 52 are inserted into corresponding holes formed in the retaining plate 51, the terminals 52-1 are bent on the flexible board 10 and are connected to the conductive patterns 11 with electrically conductive bonding agent. A reinforcing sheet comprising a resin film of the same material as that of the flexible board 10 is placed thereon, and the reinforcing sheet and the flexible board 10 are locally welded together ultrasonically at portions devoid of the terminals 52-1.

Though the mounting structure of the tantalum capacitor 53 also is not illustrated, two terminals 53-1 of the capacitor 53 are inserted into corresponding holes formed in the retaining plate 51, the terminals 53-1 are bent on the flexible board 10 and are connected to the conductive patterns 11 by electrically conductive bonding agent. A reinforcing sheet comprising a resin film of the same material as that of the flexible board 10 is placed thereon, and the reinforcing sheet and the flexible board 10 are locally welded together ultrasonically at portions devoid of the terminals 53-1.

An electrically conductive paste, which consists of metal powder kneaded in a resin, is used as the conductive bonding agent for bonding the terminal pieces 31, 41, the terminals of the connectors 54, 55, the terminals of the semi-fixed resistor 52 and the terminals 53-1, 53-2 of the tantalum capacitor 53 to the conductive patterns 11 consisting of aluminum foil.

In order to achieve electrical conduction between the terminal pieces and the conductive patterns 11 in the direction of film thickness in the case of the present embodiment, good electrical contact between the metals is required. In a case where aluminum foil is used to form conductive patterns 11, a metal disposed close in the electrochemical series to aluminum is used as the terminals. More specifically, with the element serving as an electrode in a solution where the ionic activity is 1, a metal exhibiting an electrode-solution potential difference near that of aluminum (Al) is used. Examples are metals such as titanium (Ti), manganese (Mn), zinc (Zn), chromium (Cr), thallium (Tl) and nickel (Ni), as well as compounds and alloys of such metals.

Since too many conductive passes will develop in the direction of film thickness resulting in an increase in contact resistance if the particle diameter of the metal powder is too small, a particle diameter of from several microns to no more than 14 or 15 microns is preferred.

FIG. 12 is a chart showing contact resistance (milliohms) of the electrically conductive paste relative to aluminum in a humidity resistance experiment, at a temperature of 60° C. and a relative humidity of 90-95% and respectively measured at time periods of 0, 100, 250 and 500 hours after application, the conductive paste comprising a mixture of polyester resin and nickel powder kneaded together. The metal fragment bonded to the aluminum in the experiment was solder-plated phosphor bronze. In FIG. 12, 0 represents a case where 50% (weight ratio) nickel powder having a particle diameter of 2-3 microns was used in mixture with the resin, ∆ a case where 50% (weight ratio) nickel powder having a particle diameter of 3-7 microns was used in mixture with the resin, ☐ a case where 50% (weight ratio) nickel powder having a particle diameter of 8-12 microns was used in mixture with the resin, ■ a case where 40% (weight ratio) nickel powder having a particle diameter of 2-3 microns and 10% (weight ratio) nickel powder having a particle diameter of 8-12 microns were used in mixture with the resin, and ▲ a case where 40% (weight ratio) nickel powder having a particle diameter of 2-3 microns and 20% (weight ratio) nickel powder having a particle diameter of 8-12 microns were used in mixture with the resin. It should be evident from FIG. 12 that a comparatively stable contact resistance can be obtained when a 50% (weight ratio) nickel powder having a particle diameter of 8-12 microns mixture is used or when a 40% (weight ratio) nickel powder having a particle diameter of 2-3 microns and 10% (weight ratio) nickel powder having a particle diameter of 8-12 microns is used.

Too low of a metal powder content will result in unstable electrical conduction, whereas too high of a metal powder content will weaken mechanical adhesion by an amount corresponding to the lack of resin. The resin in the electrically conductive paste seals off the affixed portions and thus acts to protect these portions from various environmental conditions, such as moisture and harmful gases. If the amount of resin contained in the conductive paste is too small, the sealing action will diminish and the paste will no longer be suitable. Accordingly, though the metal powder content is 50% in terms of the weight ratio in the present embodiment, it has been confirmed that good results can be obtained using a metal powder content of from 20% to 70%. The present invention, though, contemplates an electrically conductive paste consisting of a mixture of 80-30% and 20-70% metal powder, in terms of weight ratio, kneaded together.

Figure 13A:
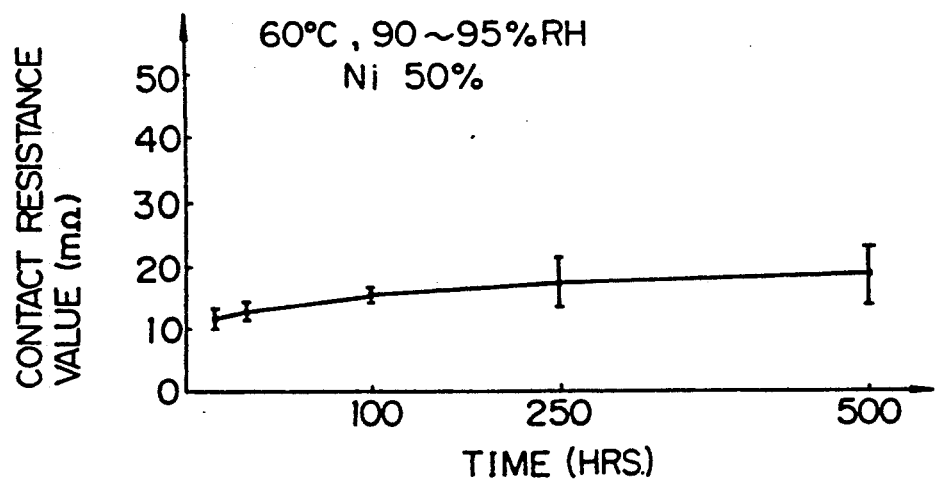
FIGS. 13(A)-13(C) are graphs showing the results obtained by measuring contact resistance (milliohms) relative to aluminum in a humidity resistance experiment using an electrically conductive paste comprising a mixture of polyester resin and nickel powder, various mixture ratios of the nickel powder being used to obtain the results in FIGS. 13(A)-13(C), respectively.
Figure 13B:
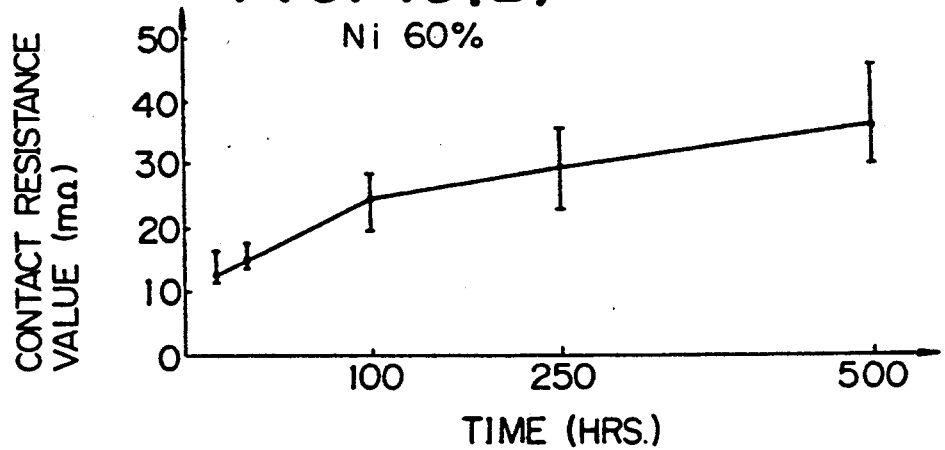
Figure 13C:
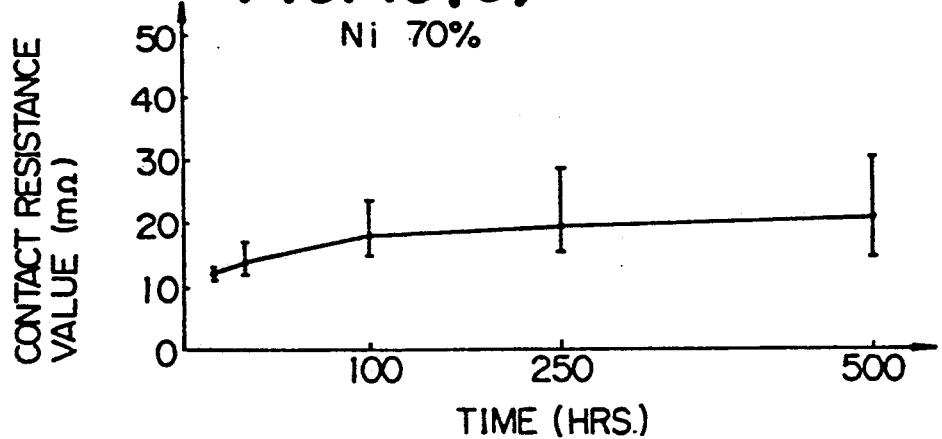

FIGS. 13(A)-13(C) are graphs of results obtained by measuring contact resistance (milliohms) between aluminum foil and a metal fragment (solder-plated phosphor bronze) in a humidity resistance experiment, at a temperature of 60° C. and a relative humidity of 90-95% and respectively measured initially and at the periods of 100, 250 and 500 hours after application, using an electrically conductive paste comprising a mixture of polyester resin and nickel powder kneaded together as a bonding agent. The amount of nickel powder was varied to values of 50% (weight ratio), 60% (weight ratio) and 70% (weight ratio). The nickel powder used had a particle diameter of 8-12 microns.

FIG. 14 is a table of results obtained by measuring contact resistance (milliohms) between aluminum foil and a metal fragment (solder-plated phosphor bronze) when using an electrically conductive paste comprising a mixture of polyester resin and nickel powder as well as other types of electrically conductive pastes as bonding agents. The weight ratios of nickel powder, copper powder, silver powder and solder powder relative to polyester resin were 50% in all cases.

It should be apparent from FIG. 14 that the conductive paste consisting of a mixture of polyester resin and nickel powder exhibits an initial contact resistance value lower than that of the mixtures containing copper powder, silver or solder as the metal powder. In particular, when the polyester film and reinforcing film are locally welded ultrasonically, the oscillation produced by the ultrasonic waves is transmitted to the nickel powder in the conductive paste, thereby breaking through the thin oxide film at the surface thereof. This has the effect of improving conductivity (see the result "YES" in the "ULTRASONIC WELDING" column of Table 14). A humidity resistance experiment was conducted at a temperature of 60° C. and a relative humidity of 90-95%. The results in Table 14 show that the mixture containing the nickel powder exhibits less contact resistance than the mixtures containing the other metal powders.

In the foregoing embodiment, the oscillation produced when the polyester film and reinforcing film are locally welded together ultrasonically is transmitted to the nickel powder in the conductive paste, thereby breaking through the thin oxide film at the surface to improve conductivity. However, it is of course permissible to apply the ultrasonic oscillation directly to the conductive paste. It should also be noted that the invention is not limited to ultrasonic oscillation, for high-frequency oscillation may be employed if desired.

The conductive paste obtained by mixing nickel powder with the polyester resin is applied to the conductive patterns 11, and the terminal pieces are placed thereon and connected thereto by being heated and then allowed to dry.

Figure 15A:
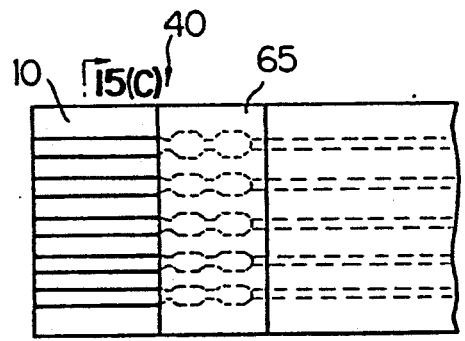
Figure 15C:
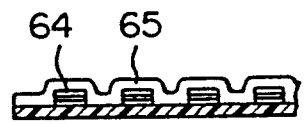
Figure 15B:
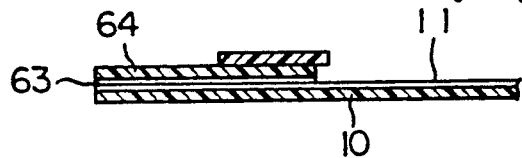
Figure 16:
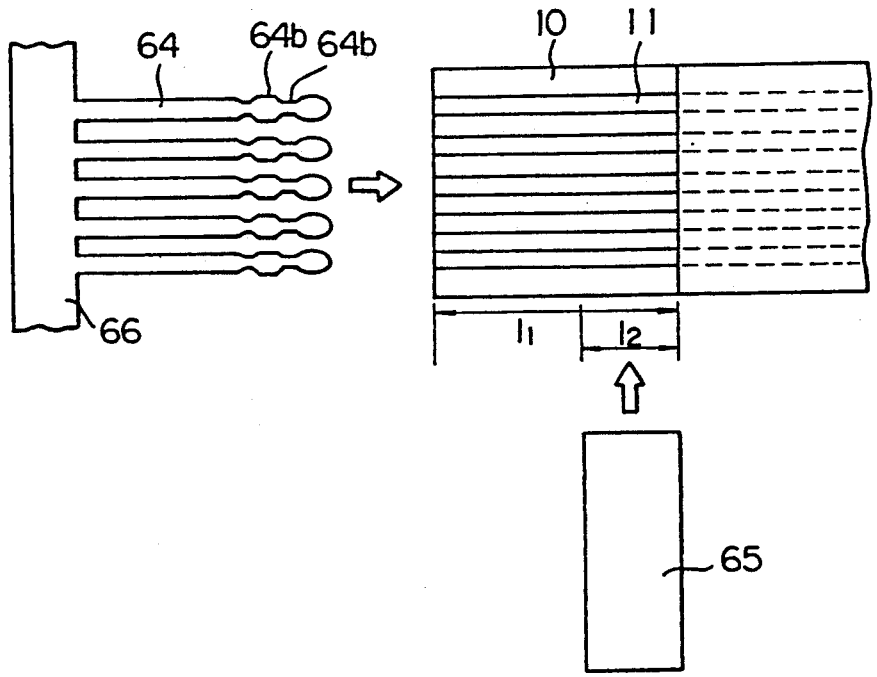
FIG. 16 is a view for illustrating a method of manufacturing the terminal portion.

FIGS. 15(A)-15(C) illustrate another structure of the terminal portion 40, in which FIG. 15(A) is a plan view, FIG. 15(B) a side sectional view and FIG. 15(C) a sectional view taken along line 15(C)-15(C) in FIG. 15(A). In the present embodiment, slender, elongated metal pieces 64 are joined to the conductive patterns 11 at the end portion of the flexible board 10 by means of an electrically conductive bonding agent 63. A reinforcing sheet 65 made of the same resin material as the flexible board 10 is placed on the flexible board leaving a predetermined length ($l_1$ in FIG. 16, measured from the distal end of the flexible board) of the metal pieces 64 and flexible board 10 exposed. The reinforcing sheet 65 and flexible board 10 are locally welded to complete the fabrication of the terminal portion 40. A method of manufacturing the terminal portion 40 will now be described with further reference to FIG. 16.

The conductive patterns 11 on the end portion (the portion whose length is $l_1$) of the flexible board are exposed, with the other portions of these patterns being covered by a resin made of polyester or the like. The exposed conductive patterns 11 (of length $l_1$) at the end portion of the flexible board 10 are coated with an electrically conductive bonding agent (not shown) consisting of a mixture of polyester resin and nickel powder.

The metal pieces 64 have a configuration obtained by integrally forming comparatively strong, rigid metal plates in the copper family, such as metal plates of phosphor bronze, and a plurality (five in the illustrated embodiment) support plates 66 by sheet-metal working. The metal pieces 64 are placed on the conductive patterns 11 coated with the conductive bonding agent, and heat is applied to join them to the conductive patterns 11 via the bonding agent. In order to maintain good electrical contact, the surfaces of the metal pieces 64 are treated, as by being plated with solder, to prevent oxidation.

Next, the reinforcing sheet 65 (length $l_2$) comprising polyester film is disposed on irregular portions 64b of the metal pieces 64 joined to the conductive patterns 11, and the flexible board 10 and reinforcing sheet 65 are locally welded together ultrasonically except at locations where the irregular portions 64b of the metal pieces 64 reside. The welding operation strongly secures the metal pieces 64 to the flexible board 10. If a pulling force should happen to be applied to the metal pieces 64, the irregular pieces 64b thereof will engage the welds and prevent the metal pieces 64 from being readily pulled off the end of the flexible board 10. After the reinforcing sheet 65 is welded in place, the metal pieces 64 are cut off at the distal end of the flexible board 10 to complete the fabrication of the terminal portion 40.

By constructing the terminal portion 40 in the manner described above, the portions (corresponding to length $l_1$-length $l_2$) of the metal pieces 64 not covered by the reinforcing sheet 65 are left exposed and, at the same time, the flexible board 10 is reinforced by the metal pieces 64 and reinforcing sheet 65.

Figures 17A, 17B:
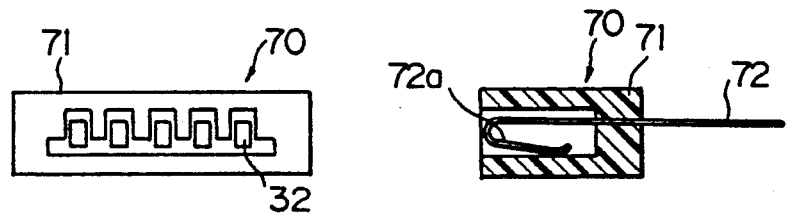

FIGS. 17(A), (B) illustrate the structure of a clamping-type connector for accommodating the terminal portion 40 provided on the end of the flexible board 10. FIG. 17(A) is a front view and FIG. 17(B) a side sectional view. As shown in these figures, a clamping-type connector 70 includes a connector case 71, which consists of a resin, and a metal terminal piece 72 provided on the connector case 71. The tip of the metal terminal piece 72 is bent to form a contact portion 72a.

Figure 18:
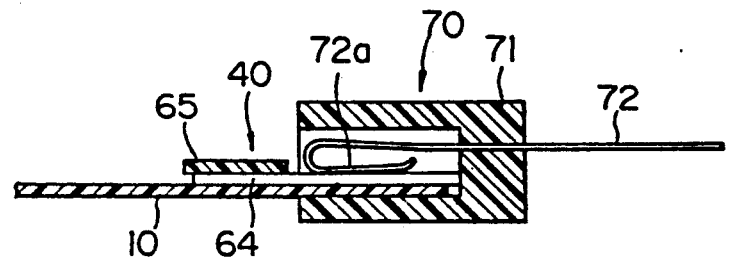
FIG. 18 is a side sectional view of the terminal portion of a flexible board in a state inserted into the clamping-type connector.

The terminal portion 40 of the flexible board 10 is inserted into the clamping-type connector 70 having the foregoing structure, whereby the contact portion 72a of the metal terminal piece 72 is brought into pressing contact with the metal piece 64, as shown in FIG. 18, so that the conductive pattern 11 of the flexible board 10 is electrically connected to the metal terminal piece 72 via the metal piece 64.

Figure 19A:
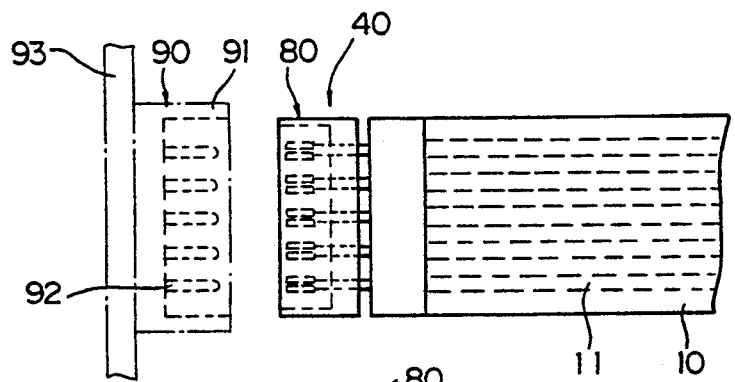
FIGS. 19(A), (B) illustrate another structure of the terminal portion; wherein FIG. 19(A) illustrate a female connector connected to the end portion of a flexible board, as well as a male connector fitted into the female connector.
Figure 19B:
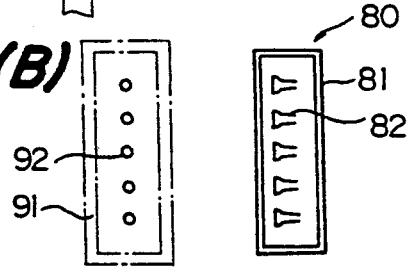
FIG. 19(B) is a front view of the female connector and male connector.

FIGS. 19(A), (B) illustrate still another structure of the terminal portion 40. FIG. 19(A) is a view illustrating a female connector connected to the end portion of the flexible board 10 as well as a male connector fitted into the female connector, and FIG. 19(B) a front view of the female connector and male connector. Here the terminal portion has a structure in which a female connector 80 is attached to the end portion of the flexible board 10. By thus attaching the female connector 80 to the end of the flexible board 10, the female connector 80 may be inserted into a male connector 90 secured to a board 93, by way of example, whereby male pins 92 of the male connector 90 come to be inserted into corresponding ones of female pins 82 of the female connector 80 so that the conductive patterns 11 on the flexible board 10 are electrically connected to corresponding ones of the male pins 92 of the male connector 90.

Figure 20A:
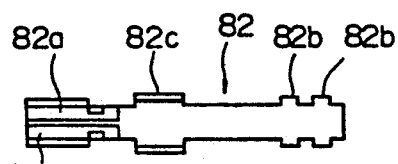
Figure 20B:
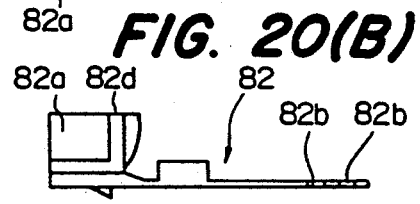
Figure 20C:
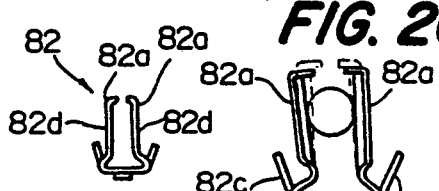
Figure 20D:
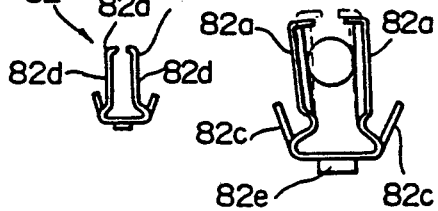

The female connector 80 has a structure in which a box-shaped connector case 81 is provided with a plurality (five in the illustrated embodiment) of female pins 82, the rear ends of which project from the connector case 81. FIGS. 20(A)-(D) illustrate, the structure of the female pin 82. FIG. 20(A) is a plan view, FIG. 20(B) a side view, FIG. 20(C) a front view and FIG. 20(D) a front view of the female pin and the male pin fitted therein. As for the structure of the female pin 82, the pin comprises clamping portions 82a, 82a for clamping the male pin 92, resilient fixing portions 82c, 82c for resiliently securing the female pin 82 within the connector case 81, lugs 82b, 82b formed on side portions, and an anchoring portion 82e which prevents the female pin 82 from falling out of the connector case 81. Formed on the inner side of the clamping portion 82d is a contact portion 82 for contacting the male pin 92. When the female connector 80 is inserted into the connector 90, each male pin 92 is inserted between the contact portions 82d, 82d of a respective female pin 82 and is clamped by the resilient force of the clamping portions 82a, 82a so that the female pins 82 and male pins 92 are electrically connected.

Figure 21A:
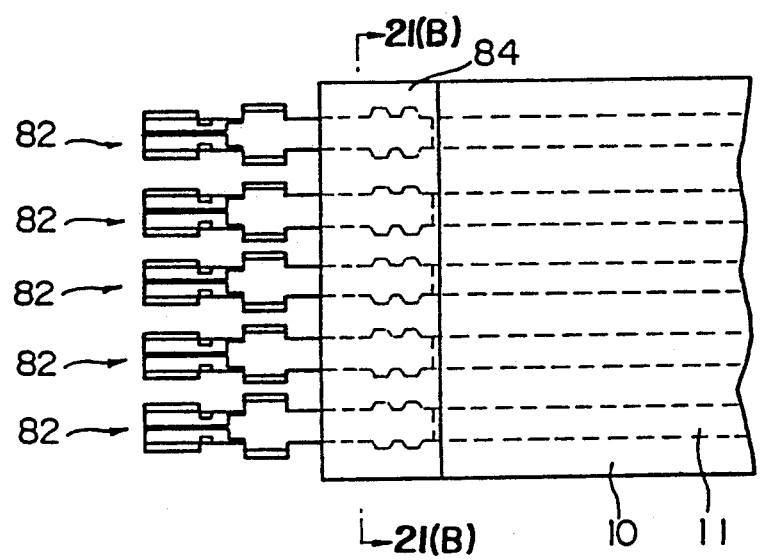
Figure 21B:
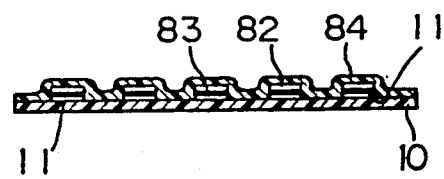
Figure 21C:
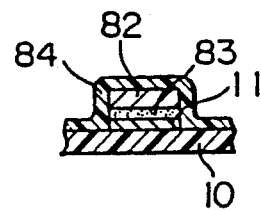

FIGS. 21(A)-21(C) illustrate the female pins 82 having the foregoing structure in a state connected to the end portion of the flexible board 10 FIG. 21(A) is a plan view, FIG. 21(B) a sectional view taken along line 21(B)—21(B) of FIG. 21(A), and FIG. 21(C) an enlarged view of a portion of FIG. 21(B). The conductive patterns 11 on the end portion of the flexible board 10 are coated with a hot melt-type conductive bonding agent 83, the female pins 82 are placed on the conductive bonding agent 83 and heat is applied to bond the female pins 82 to the conductive patterns 11. Next, the terminal portions 82e of the female pins are covered by a reinforcing sheet 84 comprising a resin film consisting of the same material as the flexible board 10, and the conductive patterns 11 and reinforcing sheet 84 are locally welded together ultrasonically except at portions where the female pins 82 are located. As a result, the female pins 82 are strongly affixed to the end portion of the flexible board 10. Thus, if a pulling force is applied to the female pins 82, the lugs 82b will engage the welds between the flexible board 10 and reinforcing sheet 84 to make it all the more difficult for the pins 82 to be pulled out.

After the plurality of female pins 82 are affixed to the end portion of the flexible board 10 in the manner set forth above, the female pins 82 are inserted into the connector case 81 (the specific structure of which is deleted), and the female pins 82 are secured to the connector case 81 and are prevented from being pulled out by the action of the resilient fixing portions 82c and anchoring portions 82c. As a result, the female connector 80 is connected to the end portion of the flexible board 10. The electrically conductive bonding agent 83 is a mixture of polyester resin and nickel powder, similar to that set forth earlier, and takes into consideration the contact resistance with respect to the conductive patterns 11, which comprise aluminum foil. In the foregoing embodiment, an example is described in which the end portion of the flexible board 10 is provided with the female connector 80 having a plurality of female pins 82 in the connector case 81. However, it goes without saying that the female connector can be replaced by a male connector having a plurality of male pins in a connector case.

In the embodiments described above, the mount for electronic parts is used in the pick-up mechanism of a CD apparatus. However, the mount of the invention is not limited to such an application but can be utilized as an electronic parts mount in a wide variety of electronic devices. The characterizing feature of the mount according to the invention is that terminals of various electronic parts are connected by an electrically conductive bonding agent to electrically conductive patterns on a flexible board comprising a thermoplastic resin on which the electrically conductive patterns are formed, the resulting connections are covered by a reinforcing sheet comprising a resin film consisting of the same material as the flexible board, and the flexible board and reinforcing sheet are locally welded together by ultrasonic welding. In particular, since the electronic parts can be mounted on the flexible board 10 comprising the thermoplastic resin film without soldering, a mount for the electronic parts can be provided at a low cost.

In the foregoing, the conductive patterns and the terminals of the electronic parts are covered by the reinforcing sheet, and the flexible board and reinforcing sheet are locally welded together ultrasonically. However, such an arrangement is not absolutely essential and the reinforcing sheet can be deleted if the electrically conductive bonding agent has sufficient adhesive strength. In particular, if the electronic parts and the flexible board 10 are molded in resin, this will assure a strong joint between the conductive patterns and the terminals of the electronic parts and will enable the reinforcing sheet to be omitted.

In addition, the electronic parts which are required to be mounted with a high positional accuracy are integrally molded along with the flexible board in resin having a low coefficient of thermal expansion and low coefficients of absorption and expansion. This makes it possible to achieve such high positional accuracy without dimensional variation and distortion as caused by changes in temperature.

In the foregoing embodiments, examples are described in which one part, namely the light-receiving element 21, mounted on the flexible board 10 is integrally molded in resin along with the flexible board. However, the invention is not limited to such an arrangement. That is, it goes without saying that after various electronic parts are mounted on the above-described thermoplastic flexible board, the placement and positioning of these parts is taken into consideration and either some or all of the parts can be molded in resin together with the flexible board or the parts can be divided into a plurality of groups individually molded in resin together with the flexible board on a group-by-group basis. If there is the danger that a group of electronic parts will be exposed to humidity or water, then resin-molding the group along with the flexible board will result in the group being covered with the resin material. This will have the effect of enhancing moisture resistance. In a case where the only requirement is mechanical strength or dimensional precision where the electronic parts are attached, all of the parts need not be molded in resin; those parts not requiring such strength or precision can be left exposed from the resin-molded portions.

In accordance with the present invention as described above, the following advantages are obtained.

Various electronic parts are mounted by having their terminals connected by means of an electrically conductive bonding agent to conductive patterns on a flexible board comprising a thermoplastic film. This makes it possible to inexpensively realize an electronic parts mount which does not rely upon soldering.

Some or all of the mounted electronic parts are resin-molded along with the flexible board to be integrated therewith. Accordingly, when the mount is incorporated in an electronic device and an electronic part requires high positional precision, as in the case of the light-receiving element of a pick-up mechanism in a CD apparatus, the part is integrated with the flexible board by resin-molding and the resulting molded body is fixed at a predetermined positioning location, thereby making it possible to secure the electronic part with the required positional precision.

The electrically conductive patterns formed on the flexible board are produced by etching aluminum foil. This provides a greater current capacity in comparison with electrically conductive patterns formed by printing of a silver paste.

In accordance with the invention, an electrically conductive paste, which is a mixture of metal powder such as nickel powder and resin kneaded together, is used as the electrically conductive bonding agent. This is advantageous in that excellent, stable electrical contact is obtained between a metal foil comprising, for example, aluminum and the terminals of the electronic parts.

Since the electronic parts are mounted on the flexible board, a great degree of freedom is obtained in terms of accommodating and arranging the mount in a case.

As many apparently widely different embodiments of the present invention can be made without departing from the spirit and scope thereof, it is to be understood that the invention is not limited to the specific embodiments thereof except as defined in the appended claims.

What is claimed is:

1. A mount for mounting electronic parts to an electronic device, comprising:
    a flexible board consisting of a thermoplastic resin film and having a pattern of electrically conductive material thereon;
    electronic parts having terminals overlying said pattern of electrically conductive material;
    an electrically conductive bonding agent interposed between said terminals and said pattern of electrically conductive material and bonding the terminals of said electronic parts directly to said electrically conductive material to thereby define bonded portions at which the electronic parts are bonded to said flexible board; and
    at least some of the electronic parts and said flexible board being integrated by resin molded around said at least some of the electronic parts and a portion of said flexible board.

2. The mount according to claim 1, further comprising a reinforcing sheet consisting of a film of the same thermoplastic resin as said flexible board, said bonded portions being covered by said reinforcing sheet, and said flexible board and said reinforcing sheet being locally welded together.

3. The mount according to claim 1 or 2, wherein said electrically conductive material is aluminum foil.

4. The mount according to claim 1, wherein said electrically conductive bonding agent comprises an electrically conductive paste consisting of a mixture of resin and metal powder having been kneaded together, the terminals of said electronic parts being bonded to said electrically conductive material as the result of an application of high frequency oscillations to said electrically conductive paste.

5. The mount according to claim 2, wherein said electrically conductive bonding agent comprises an electrically conductive paste consisting of a mixture of resin and metal powder having been kneaded together, the terminals of said electronic parts being bonded to said electrically conductive material as the result of an application of high-frequency oscillations to said electrically conductive paste.

6. The mount according to claim 3, wherein said electrically conductive bonding agent comprises an electrically conductive paste consisting of a mixture of resin and metal powder having been kneaded together, the terminals of said electronic parts being bonded to said electrically conductive material as the result of an application of high-frequency oscillations to said electrically conductive paste.

7. The mount according to claim 6, wherein said electrically conductive paste consists of a mixture of 80–30% resin and 20–70% metal powder, in terms of weight ratio, said resin and said metal powder having been kneaded together.

8. A mount for mounting electronic parts to an electronic device, comprising:

a flexible board consisting of a thermoplastic resin film and having a pattern of electrically conductive material thereon of etched metal foil;

metal terminal pieces having distal ends projecting from an end portion of said flexible board;

electrically conductive bonding agent bonding said electrically conductive material to said metal terminal pieces; and a reinforcing sheet consisting of a film of the same thermoplastic resin as said flexible board, said reinforcing sheet being disposed on said flexible board and locally welded to said flexible board except at portions where said metal terminal pieces are located.

9. The mount according to claim 8, wherein said electrically conductive material is aluminum foil.

10. The mount according to claim 8 or 9, wherein said electrically conductive bonding agent comprises an electrically conductive paste consisting of a mixture of resin and metal powder having been kneaded together, the terminals of said electronic parts being bonded to said electrically conductive patterns as the result of an application of high-frequency oscillations to said electrically conductive paste.

11. The mount according to claim 10, wherein said electrically conductive bonding agent comprises a mixture of 80-30% resin and 20-70% metal powder, in terms of weight ratio, said resin and said metal powder having been kneaded together.

12. A mount for mounting electronic parts to an electronic device, comprising:

a flexible board consisting of a thermoplastic resin film and having a pattern of electrically conductive material thereon, said flexible board having a distal end portion;

metal terminal pieces having distal ends substantially terminating with the distal end portion of said flexible board and bonded to said electrically conductive material; and a reinforcing sheet consisting of a film of the same thermoplastic material as said flexible board, said reinforcing sheet being disposed on said flexible board and leaving exposed a predetermined length of said metal terminal pieces as measured from the distal end portion of said flexible board, said reinforcing sheet being locally welded to said flexible board except at portions where said metal terminal pieces are located.

13. The mount according to claim 12, wherein said electrically conductive material is aluminum foil.

14. The mount according to claim 12 or 13, wherein said electrically conductive bonding agent comprises an electrically conductive paste consisting of a mixture of resin and metal powder having been kneaded together, said metal terminal pieces being bonded to said electrically conductive material as the result of the application of high-frequency oscillations to said electrically conductive paste.

15. The mount according to claim 14, wherein said electrically conductive bonding agent comprises a mixture of 80-30% resin and 20-70% metal powder, in terms of weight ratio, said resin and said metal powder having been kneaded together.

16. A mount for mounting electronic parts to an electronic device, comprising:

a flexible board consisting of a thermoplastic resin film and having a pattern of electrically conductive material thereon;

a connector comprising a connector case and plurality of connector pins provided within said connector case and projecting outwardly therefrom, said connector pins being superposed on said pattern of electrically conductive material;

an electrically conductive bonding agent bonding said connector pins to said electrically conductive material; and a reinforcing sheet consisting of a film of the same thermoplastic resin as said flexible board, said reinforcing sheet being disposed on said flexible board and locally welded to said flexible board except at portions where said connector pins are located.

17. The mount according to claim 16, wherein said electrically conductive material is aluminum foil.

18. The mount according to claim 16 or 17, wherein said electrically conductive bonding agent comprises an electrically conductive paste consisting of a mixture of resin and metal powder having been kneaded together, the connector pins being bonded to said electrically conductive material as the result of an application of high-frequency oscillations to said electrically conductive paste.

19. The mount according to claim 16, wherein said electrically conductive bonding agent comprises a mixture of 80-30% resin and 20-70% metal powder, in terms of weight ratio, said resin and said metal powder having been kneaded together.

* * * * *